(12) United States Patent
May

(10) Patent No.: US 11,906,393 B2
(45) Date of Patent: Feb. 20, 2024

(54) TRACER GAS LEAK DETECTION SYSTEM AND CORRESPONDING USE

(71) Applicant: ATEQ, Les Clayes sous Bois (FR)

(72) Inventor: Thierry May, Les Clayes-sous-Bois (FR)

(73) Assignee: ATEQ, Les Clayes Sous Bois (FR)

(*) Notice: Subject to any disclaimer, the term of this patent is extended or adjusted under 35 U.S.C. 154(b) by 430 days.

(21) Appl. No.: 17/310,224

(22) PCT Filed: Jan. 27, 2020

(86) PCT No.: PCT/EP2020/051865
§ 371 (c)(1),
(2) Date: Jul. 27, 2021

(87) PCT Pub. No.: WO2020/156973
PCT Pub. Date: Aug. 6, 2020

(65) Prior Publication Data
US 2022/0252479 A1    Aug. 11, 2022

(30) Foreign Application Priority Data
Jan. 29, 2019 (FR) ..................... 1900806

(51) Int. Cl.
*G01M 3/20* (2006.01)
*G01R 19/12* (2006.01)

(52) U.S. Cl.
CPC .............. *G01M 3/20* (2013.01); *G01R 19/12* (2013.01)

(58) Field of Classification Search
None
See application file for complete search history.

(56) References Cited

U.S. PATENT DOCUMENTS

| 3,355,932 A | 12/1967 | Mulligan |
| 4,494,402 A | 1/1985 | Carney |
| 4,686,851 A | 8/1987 | Holm et al. |
| 4,954,087 A | 9/1990 | Lauks et al. |
| 5,111,137 A | 5/1992 | Heumann et al. |
| 5,206,097 A | 4/1993 | Burns et al. |
| 5,539,354 A * | 7/1996 | Carsten ............... G01R 15/183 327/345 |

(Continued)

FOREIGN PATENT DOCUMENTS

| DE | 43 35 894 A1 | 4/1995 |
| DE | 69623171 T2 | 4/2003 |

(Continued)

OTHER PUBLICATIONS

Intitut national de recherche et de securite, Edition INRS ED 6088, Detecteurs portables de gaz et de vapeurs; ED6088 Aide-Memoire Technique, pp. 1-15.

*Primary Examiner* — Herbert K Roberts
(74) *Attorney, Agent, or Firm* — Young Basile Hanlon & MacFarlane, P.C.

(57) ABSTRACT

The invention relates to a tracer gas leak detection system including at least one sensor delivering a signal, referred to as the sensor signal, which is representative of a concentration of the tracer gas at the sensor. The tracer gas leak detection system includes, for at least one given sensor, a corresponding phase advance correction device delivering a corrected signal from the sensor signal delivered by the given sensor.

12 Claims, 2 Drawing Sheets

(56) References Cited

U.S. PATENT DOCUMENTS

| | | | |
|---|---|---|---|
| 5,546,789 A | 8/1996 | Balke et al. | |
| 5,661,229 A | 8/1997 | Bohm et al. | |
| 5,795,995 A | 8/1998 | Shimaoka et al. | |
| 6,033,233 A | 3/2000 | Haseyama et al. | |
| 6,082,184 A * | 7/2000 | Lehmann | B65B 3/04 |
| | | | 73/49.3 |
| 6,172,505 B1 * | 1/2001 | Bertness | G01R 31/3648 |
| | | | 320/120 |
| 6,208,497 B1 * | 3/2001 | Seale | H02K 41/03 |
| | | | 361/160 |
| 6,272,902 B1 | 8/2001 | Chen et al. | |
| 6,332,350 B1 | 12/2001 | Inoue et al. | |
| 7,131,316 B2 | 11/2006 | Doehla et al. | |
| 7,779,675 B2 | 8/2010 | Wetzig et al. | |
| 7,905,132 B1 | 3/2011 | Chamberlain | |
| 2002/0008534 A1 | 1/2002 | Yamazaki | |
| 2005/0151456 A1 | 7/2005 | Yoon et al. | |
| 2008/0018355 A1 | 1/2008 | Takekoshi et al. | |
| 2008/0202212 A1 | 8/2008 | Liepert | |
| 2009/0095095 A1 | 4/2009 | Hayashi et al. | |
| 2009/0164148 A1 | 6/2009 | Shinoda | |
| 2009/0204350 A1 * | 8/2009 | Govil | B81C 99/0045 |
| | | | 702/182 |
| 2011/0163740 A1 | 7/2011 | Russell et al. | |
| 2014/0239962 A1 | 8/2014 | Oda et al. | |
| 2015/0114092 A1 | 4/2015 | Paidosh | |
| 2016/0150690 P1 | 5/2016 | Bedard | |
| 2018/0011125 A1 * | 1/2018 | Oshima | G01P 15/125 |
| 2018/0026313 A1 | 1/2018 | Fukuoka et al. | |
| 2018/0328808 A1 | 11/2018 | Jourdan et al. | |
| 2018/0328810 A1 | 11/2018 | Wetzig | |
| 2020/0182733 A1 | 6/2020 | Yao et al. | |

FOREIGN PATENT DOCUMENTS

| | | | |
|---|---|---|---|
| DE | 10 2012 214738 A1 | 2/2014 | |
| DE | 10 2014 205918 A1 | 10/2015 | |
| DE | 102011083133 B4 * | 1/2019 | G01L 27/007 |
| EP | 0 826 954 A2 | 3/1998 | |
| EP | 1214635 A1 | 6/2002 | |
| EP | 1214635 B9 * | 1/2004 | G01F 1/6847 |
| EP | 1467200 A1 | 10/2004 | |
| EP | 1467200 A1 * | 10/2004 | G01F 1/696 |
| EP | 2270458 A1 | 1/2011 | |
| EP | 2270458 B1 * | 6/2012 | G01M 3/202 |
| EP | 2672246 A1 | 12/2013 | |
| FR | 2283431 A1 | 3/1976 | |
| FR | 2558592 A1 | 7/1985 | |
| FR | 2 734053 A1 | 11/1996 | |
| FR | 2 971 501 A1 | 8/2012 | |
| GB | 2049954 A | 12/1980 | |
| WO | 0104716 A1 | 1/2001 | |
| WO | 2011132391 A1 | 10/2011 | |
| WO | 2016/150690 A1 | 9/2016 | |
| WO | 2017012904 A1 | 1/2017 | |
| WO | 2019/053121 A1 | 3/2019 | |

\* cited by examiner

TRACER GAS LEAK DETECTION SYSTEM AND CORRESPONDING USE

CROSS-REFERENCE TO RELATED APPLICATIONS

This application is filed under 35 USC 371 and claims priority benefit to PCT patent application PCT/EP2020/051865 filed Jan. 27, 2020 which claims priority benefit to France patent application serial number 1900806 filed Jan. 29, 2019, the entirety of both applications are incorporated herein by reference.

TECHNICAL FIELD

The field of the invention is that of detecting tracer gas leaks, e.g. of the hydrogen, helium, carbon dioxide, dinitrogen type, etc. More precisely, the invention relates to a tracer gas leak detection system.

BACKGROUND

Tracer gas leak detection and seal test devices are known (e.g. of the hydrogen, helium, carbon dioxide, dinitrogen type, etc.), wherein the existence of a leak is revealed by an apparatus for detecting the presence or the level of the tracer gas in a test chamber.

For example, in a certain number of applications the tracer gas is hydrogen and the detection apparatus is a hydrogen sensor. Using hydrogen sensors thus makes it possible to detect and/or measure, the presence of this gas in real time.

These sensors are well known but have a certain number of disadvantages that can be found regardless of the sensor technology considered (e.g. of the electrochemical or semiconductor type).

First of all, these hydrogen sensors have a response time (or time constant or rise time) that is relatively high due, in particular, to a capacitive effect as well as to the load transfer resistance of this type of sensor. For example, in the case of sensors that use a semiconductor technology, the resistivity of the semiconductor material varies according to the unfolding of the oxidation-reduction and/or adsorption reactions at the surface of the material. According to a guide to gas sensors from the French national institute of research and security (INRS) (ED 6088 Aide-mémoire technique, February 2011), it is known that the response time of these apparatuses is highly variable, from a few tens of seconds to several minutes, and that the service life of the sensors is about from a few weeks to several years according to the context of use. By comparing the response time of different hydrogen sensors (here, six sensors), a great variability in their response time was observed. Indeed, response times comprised between 15 and 30 seconds were measured.

Moreover, such a response time is very high with respect to the expectations/constraints of the applications in which these sensors are implemented.

Thus, there is a need to reduce the response time of tracer gas sensors.

There is also a need so that such a reduction does not substantially affect the measurement precision of the sensors in question.

SUMMARY

The invention has many applications, in particular, but not exclusively, in the field of safety (e.g. to prevent the risk of asphyxiation, the toxic risk linked to certain gases, the risk of fire or explosion, etc.), and in the field of hygiene and health (e.g. to determine exposure profiles, assist with validating air cleaning or collection systems, etc.).

In an embodiment, a tracer gas leak detection system is proposed comprising at least one sensor delivering a signal, referred to as sensor signal, which is representative of a concentration of the tracer gas at the sensor. Such a detection system further comprises, for at least one given sensor, a corresponding phase advance correction device delivering a corrected signal from the sensor signal delivered by the given sensor.

Thus, the invention proposes a new and inventive solution for detecting leaks in an improved manner Indeed, such sensors (e.g. of the electrochemical or semiconductor type) sensitive to the concentration in tracer gas (e.g. hydrogen, helium, carbon dioxide, dinitrogen, etc.) have an internal resistor which varies by following a logarithmic law when the concentration in gas increases. Thus, during a leak, the signal delivered by the sensor (e.g. a voltage developed on a load resistor) varies exponentially, or at least substantially exponentially, when the tracer gas arrives at the sensor. A phase advance correction device making it possible to improve the rise time of such an exponential or substantially exponential signal, the response time of the detection system is thereby improved.

According to an embodiment, the correction device comprises at least one overdamped correction cell configured to approximate a correction of the proportional-derivative type.

According to an embodiment, a damping factor of said at least one overdamped correction cell has a value comprised between 80 and 100 percent of a first critical value corresponding to the critical regime of said at least one overdamped correction cell, preferably a value equal to 90 percent of the first critical value.

Thus, the response time of the detection system is reduced as best as possible in relation to the time constant (or response time or rise time) of the sensor. For example, the final value of the signal delivered by the sensor is reached at the output of the overdamped correction cell or cells after a time comprised between $0.002*\tau$ and $0.008*\tau$, with $\tau$ the time constant of the sensor.

According to an embodiment, the damping factor of said at least one overdamped correction cell corresponds to the ratio between a time constant associated with the dominant zero of a transfer function of said at least one overdamped correction cell and a time constant of the sensor.

According to an embodiment, the correction device comprises at least one underdamped correction cell configured to approximate a correction of the proportional-derivative type.

According to an embodiment, a damping factor of said at least one underdamped correction cell has a value comprised between 110 and 130 percent of a second critical value corresponding to the critical regime of said at least one underdamped correction cell, preferably a value equal to 120 percent of the second critical value.

Thus, the final value reached by the corrected signal delivered by the underdamped cell or cells is coherent (i.e. is substantially equal), to the final value of the signal delivered by the sensor. For example, when the damping factor of the overdamped correction cell or cells is chosen equal to 90 percent of the value corresponding to its critical regime, and when the damping factor of the underdamped correction cell or cells is chosen equal to 120 percent of the value corresponding to its critical regime, a substantially unity gain is obtained for the detection system composed of an overdamped cell or cells and an underdamped cell or cells in question when the corrected signal is observed after an establishment time of about 0.005*τ.

According to an embodiment, the damping factor of said at least one underdamped correction cell corresponds to the ratio between a time constant associated with the dominant zero of a transfer function of said at least one underdamped correction cell and the time constant of the sensor.

According to an embodiment, said at least one overdamped correction cell delivers a first corrected signal from the sensor signal, and said at least one underdamped correction cell delivers the corrected signal from the first corrected signal.

According to an embodiment, said at least one overdamped correction cell and/or said at least one underdamped correction cell is implemented in an active analogical form.

For example, the overdamped and underdamped cell or cells in question are implemented in the form of assemblies with a looped-back operational amplifier base. In this way, the adaptation problems of impedance, or of dispersion of the components used (capacitors, resistors), are minimized within the phase advance correction device. This makes it possible, for example, to prevent the oscillations before stabilisation of the corrected signal.

In another embodiment of the invention, using a tracer gas leak detection system according to any of the aforementioned embodiments is proposed for detecting a leak by tracer gas.

BRIEF DESCRIPTION OF THE DRAWINGS

Other purposes, characteristics and advantages of the invention shall appear more clearly when reading the following description, given simply for the purposes of illustration, and in no way limiting, in relation with the figures, among which.

DETAILED DESCRIPTION

In all the figures of the present document, identical elements and steps are designated by the same reference.

The general principle of the invention is based on the implementation of a phase advance correction device in order to improve the response time (or time constant or rise time) of a sensor (e.g. of the electrochemical or semiconductor type) of tracer gas (e.g. of the hydrogen, helium, carbon dioxide, dinitrogen, etc. type).

Figure 1:
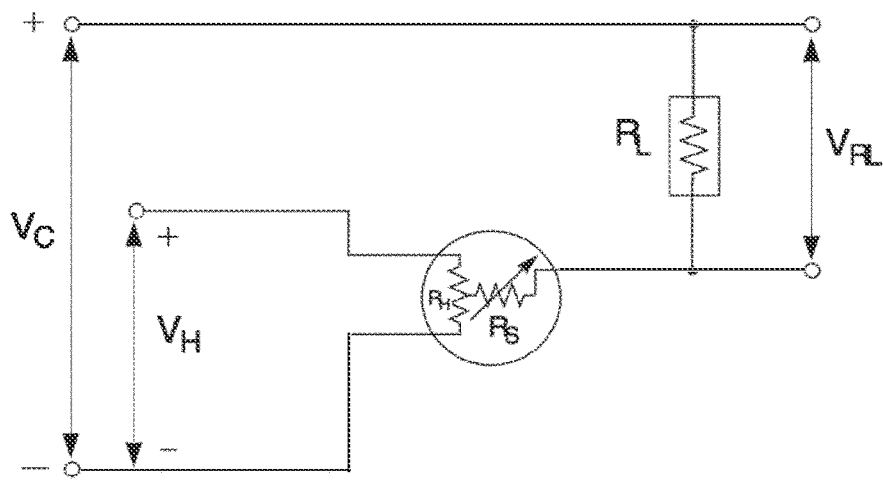
FIG. 1 shows an equivalent electrical diagram of the gas detection semiconductor sensor SB-19 of the company FIS®.
Figure 2:
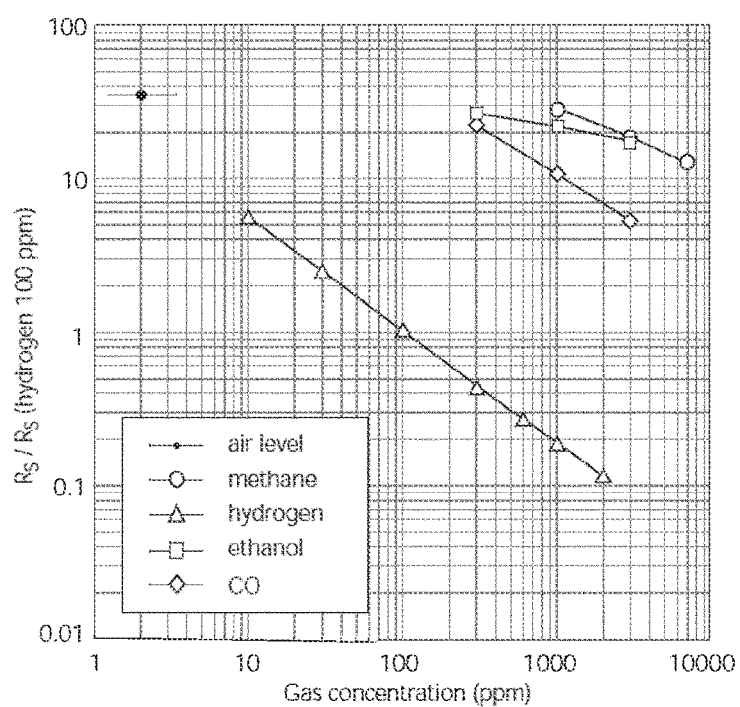
FIG. 2 shows the change in the internal resistor of the equivalent electrical diagram of FIG. 1 according to the concentration of gas at the sensor SB-19.

In relation with FIG. 1 and FIG. 2 the characteristics of the equivalent electrical diagram of the gas detection semiconductor sensor SB-19 of the company FIS® are now presented.

Indeed, the gas sensor SB-19 is a typical semiconductor sensor to which the invention can be applied. The sensor in question is of the tin dioxide type, which allows for low energy consumption (120 mW), thus making it particularly suitable for integration into a portable gas detection system.

The sensor has a metal case comprising a wall formed from a double stainless steel mesh and located in the path of the gas stream. The case encloses a detection element in the form of a drop (or pearl) comprising a heating coil and an electrode. The sensor SB-19 also has a particularly long response time, i.e. about from 15 to 30 seconds (s).

As shown in the equivalent electrical diagram of the sensor SB-19 shown in FIG. 1, as well as the change in the internal resistor of the electrical diagram in question shown in FIG. 2 according to the concentration of gas at the sensor SB-19, the sensor in question behaves as a source of voltage of which the internal resistor RS is variable according to the concentration of gas at the sensor. The sensor this developed a voltage VRL, variable and according to the concentration of gas at the sensor, at the terminals of a load resistor RL.

The sensitivity characteristics of such a sensor are expressed by the relation between the internal resistor RS and the concentration of the gas at the sensor in question.

More particularly, this type of sensor is announced as making it possible to detect hydrogen content comprised between 100 ppm and 1,000 ppm. The internal resistor of the sensor RS decreases with the increase in the concentration of gas by following a logarithmic law as shown in FIG. 2. In this way, for a given load resistor RL, the developed voltage VRL varies exponentially, or at least substantially exponentially, when the gas arrives at the sensor. In other terms, the sensor responds as a first-order linear system, e.g. like a by-pass mounted RC filter (for "resistor-capacitor") and of which the capacitor would be charged at the arrival of the gas in contact with the sensor until reaching a value that is representative of the concentration of gas at the sensor.

The same type of behaviour is obtained with different sensor technologies (e.g. of the electrochemical or semiconductor type), and for sensors sensitive to different types of tracers gases (e.g. of the hydrogen, helium, carbon dioxide, dinitrogen, etc. type).

Figure 3:
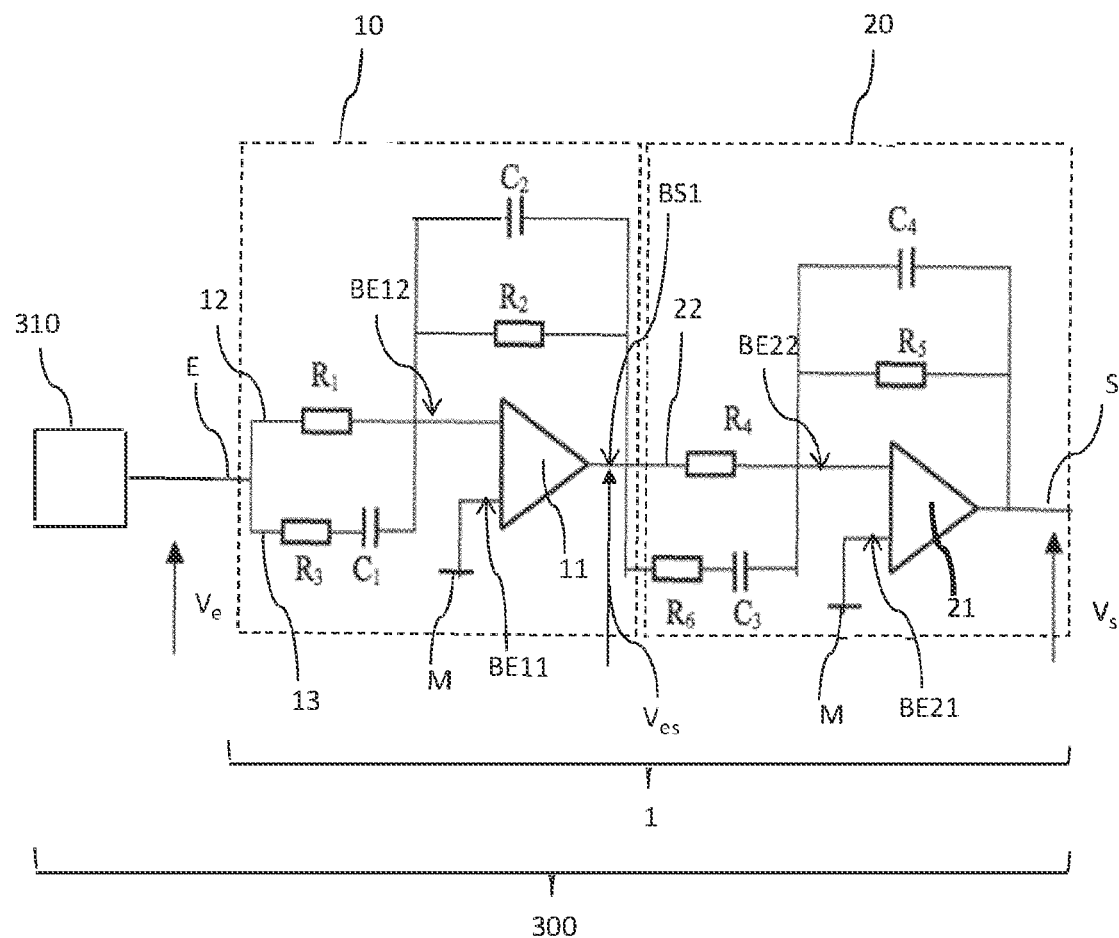
FIG. 3 shows a tracer gas leak detection system according to an embodiment of the invention.

In relation with FIG. 3 a tracer gas leak detection system 300 according to an embodiment of the invention is now presented.

The system 300 comprises a tracer gas sensor 310. In the embodiment shown, the sensor 310 is the sensor SB-19 of which the characteristics have been discussed hereinabove in relation with FIG. 1 and FIG. 2. In this embodiment, the tracer gas is hydrogen. In other embodiments not shown, the gas considered is any other tracer gas (e.g. of the helium, carbon dioxide, dinitrogen, type, etc.), and the sensor is a corresponding adapted sensor (e.g. of the electrochemical or semiconductor type).

Returning to FIG. 3, the system 300 further comprises a correction device 1 delivering a corrected signal Vs from the measurement signal Ve delivered by the sensor 310. In the embodiment considered, the correction device 1 is dimensioned to be of the high impedance type and the signals in question are represented by voltages at the terminals of the load resistors. In other embodiments, the correction device 1 is dimensioned to be of the type low impedance type and the measurement signals are of the current type passing through a load resistor.

In the embodiment shown, the leak detection system comprises a single sensor. In other embodiments, the leak detection system comprises several sensors, potentially dedicated to measuring different tracer gases. In such embodiments, the leak detection system comprises at least one correction device delivering a corrected signal from the measurement signal delivered by a given sensor of the leak detection system.

Returning to FIG. 3, the correction device 1 is a phase advance correction device. Indeed, as described hereinabove in relation with FIG. 1 and FIG. 2, the sensor 310 develops a voltage that varies exponentially, or at least substantially exponentially, when the gas arrives at its level. However, a phase advance correction device 1 makes it possible, via the by-pass function that it implements, to improve the rise time of such an exponential, or substantially exponential, signal. In this way, the response time of the detection system 300 is improved with respect to the response time of the sensor 310 alone.

The phase advance correction device 1 comprises a first 10 and a second 20 correction cells of identical electronic structure, the first 10 and second 20 cells being connected in series.

More particularly, each one of the first 10 and second 20 cells is a phase advance circuit, constructed around an operational amplifier (also called "op amp" in what follows), with a feedback loop on the inverting input of the latter.

The first cell 10 comprises an op amp 11 that has a non-inverting input BE11, connected to the ground M, and an inverting input BE12. The input E of the correction device 1 is connected to the inverting input BE12 of the op amp 11 via a block comprising two branches in parallel: the first branch 12 comprises a resistor R1 and the second branch 13 comprising a resistor R3 and a capacitor C1 in series. The op amp 11 also comprises an output BS1 that is connected on the one hand to the input of the second cell 20 of the corrector 1, and on the other hand to the inverting input BE12 of the op amp 11 via a feedback loop comprising a resistor R2 and a capacitor C2 connected in parallel.

The second cell 20 of the correction device 1 has an electronic structure similar to that of the first cell 10. More precisely, the second cell 20 has an op amp 21 that has a non-inverting input BE21, connected to the ground M, and an inverting input BE22. The output BS1 of the op amp 11 (i.e. the output of the first cell 10) is connected to the inverting input BE22 of the op amp 21 via a block comprising two branches in parallel: a first branch 22 comprises a resistor R4 and a second branch 23 comprises a resistor R6 and a capacitor C3 in series.

The op amp 21 also comprises an output BS2 that is connected on the one hand to the inverting input BE22 of the op amp 21 via a feedback loop comprising a resistor R5 and a capacitor C4 connected in parallel, and on the other hand at the output S of the corrector 1.

From the diagram of FIG. 3, the transfer function of the correction device 1 can be expressed in the Laplace domain as:

$$H_{(P)} = H_{0(P)} H_{1(P)} H_{2(P)}$$

with:

$$H_{0(P)} = \frac{R_2 \times R_5}{R_1 \times R_4}$$

the zero frequency gain of the correction device 1;

$$H_{1(P)} = \frac{(1 + R_1 C_1 p + R_3 C_1 p)}{(1 + R_2 C_2 p)(1 + R_3 C_1 p)}$$

the transfer function comprising the poles and the zeros linked to the first cell 10; and $$H_{2(P)} = \frac{(1 + R_4 C_3 p + R_6 C_3 p)}{(1 + R_5 C_4 p)(1 + R_6 C_3 p)}$$

the transfer function comprising the poles and the zeros linked to the second cell 20.

Generally, $H_{1(p)}$ and $H_{2(p)}$ can be rewritten in the form:

$$H_{1(P)} = \frac{1 + \tau_1 p + \tau_2 p}{(1 + \tau_3 p)(1 + \tau_2 p)}$$

and:

$$H_{2(P)} = \frac{1 + \tau_4 p + \tau_5 p}{(1 + \tau_6 p)(1 + \tau_5 p)}$$

with:
$\tau_1 = R_1.C_1 = R_2.C_1$
$\tau_2 = R_3.C_1$
$\tau_3 = R_2.C_2 = R_1.C_2$
$\tau_4 = R_4.C_3 = R_5.C_3$
$\tau_5 = R_6.C_3$
$\tau_6 = R_5.C_4 = R_4.C_4$ Each one of the first 10 and second 20 cells has both poles and zeros and is thus generally similar to a correction cell of the type PID (Proportional, Integral and Derivative) type. In order to obtain phase advance cells, a reduction of the poles is carried out in order to make the by-pass function predominant.

To do this, it is, for example, chosen that R2=R1 and R5=R4. In this way, $H_{0(P)} = 1$.

Likewise, the poles and zeros of the correction device 1 are configured to have:
- the zeros associated with the time constants R2.C2 and R3.C3 that are dominant in the transfer function H(p) (such zeros corresponding to the by-pass function desired);
- the poles associated with the time constants R2.C2 and R5.C4, that are of the 2nd order in the transfer function H(p) (the poles in question corresponding to the integration function;
- the poles associated with the time constants R3.C1 and R6.C3, which are of the 3rd order in the transfer function H(p) (the poles in question corresponding to the stabilisation function of the device).

The reduction in the poles can thus be carried out on the auxiliary poles (i.e. of the 2nd order and of the 3rd order) where the response time considered for the poles in question is sufficiently higher than the critical response time of the correction device 1 (i.e. than the response time defined as the minimum response time that supplies an overvoltage of the signal Vs at the output of the correction device 1).

For example, by choosing $\tau_2 = \tau_3$ and $\tau_5 = \tau_6$, the following is obtained:

$$H_{1(P)} = \frac{1 + \tau_1 p + \tau_2 p}{(1 + \tau_2 p)^2}$$

and:

$$H_{2(P)} = \frac{1 + \tau_4 p + \tau_5 p}{(1 + \tau_5 p)^2}$$

By configuring the first cell 10 in such a way that $\tau_2 \ll \tau_1$, the following first order is obtained:

$$H_{1(P)} \approx 1 + \tau_1 p$$

In the hypothesis discussed hereinabove where the sensor 310 develops a voltage Ve that varies exponentially when the gas arrives, the voltage Ve in question can be written in the form:

$$V_{e(t)} = E(1 - e^{-t/\tau})$$

with τ the time constant (or response time or rise time) of the sensor 310.

Thus, based on the expression hereinabove of $H_{1(p)}$, the voltage Ves developed at the output of the first cell 10 can be written as a first order:

$$V_{es(t)} = E\left[1 - (1-m)e^{\frac{-t}{\tau}}\right]$$

with m the damping coefficient of the first cell 10, that is therefore expressed in the first order as $m=\tau_1/\tau$ (i.e. as the ratio between the time constant associated with the dominant zero of the transfer function of the first overdamped cell 10 and the time constant of the sensor).

Thus, the first cell 10 is configured to approximate a correction of the proportional-derivative type (e.g. comprising at least one by-pass function).

Generally, in order to prevent any oscillation of the signal delivered by the first cell 10, the cell in question is dimensioned to be overdamped, i.e. in order to have its damping coefficient m less than or equal to a critical value corresponding to the critical regime of the first cell 10 (the expression overdamped in the broad sense is understood here, i.e. including the critical regime corresponding to a damping coefficient equal to the critical value). For example, the damping coefficient m is configured to have a value comprised between 80 and 100 percent of the critical value of the first cell 10.

For example, the damping coefficient m is configured to have a value equal to 90 percent of the critical value of the first cell 10. Thus, the response time of the detection system 1 is reduced with respect to the time constant τ of the sensor 310. For example, the final value of the signal Ves delivered by the first cell 10 is reached at the output of the first overdamped cell 10 after a time comprised between 0.002*τ and 0.008*τ.

Moreover, by configuring the second cell 20 in such a way that τ5<<τ4, the following in the first order is obtained:

$$H_{2(P)} \approx 1 + \tau_4 p$$

Thus, still considering that $V_{e(t)} = E(1-e^{-t/\tau})$, the voltage Vs developed at the output of the second cell 20 can be written as a first order:

$$V_s = E\left[1 - (1-km')e^{\frac{-t}{\tau}}\right]$$

with m' the damping coefficient of the second cell 20, that is therefore expressed in the first order as $m'=\tau_4/\tau$ (i.e. as the ratio between the time constant associated with the dominant zero of the transfer function of the second underdamped cell 20 and the time constant of the sensor), and k a constant that simulates the effect of the first overdamped cell 10 on the signal Ve delivered by the sensor.

Thus, the second cell 20 is configured to approximate a correction of the proportional-derivative type (e.g. comprising at least one by-pass function).

However, in the embodiment considered, the second cell 20 is configured to be underdamped in order to offset the bias obtained after a predetermined time in the signal Ves delivered by the first cell 10 (which is overdamped) with respect to the signal Ve delivered by the sensor. Thus, with final value reached by the corrected signal Vs delivered by the second underdamped cell 20 is coherent (i.e. is substantially equal), to the final value of the signal Ve delivered by the sensor when considered after the predetermined time in question.

For example, the second cell 20 is dimensioned in order to have its damping coefficient m' greater than a critical value corresponding to the critical regime of the second cell 20. For example, the damping coefficient m' is configured to have a value comprised between 110 and 120 percent of the critical value of the second cell 20.

For example, when the damping factor m of the first overdamped cell 10 is chosen equal to 90 percent of the value corresponding to its critical regime, and when the damping factor of the second underdamped cell 20 is chosen equal to 120 percent of the value corresponding to its critical regime, a substantially unity gain is obtained for the detection system 1 composed of the first 10 and second 20 cells when the corrected signal Vs is observed after an establishment time of about 0.005*τ. (e.g. the final value reached by the corrected signal Vs delivered by the second underdamped cell 20 is coherent (i.e. is substantially equal), to the final value of the signal Ve delivered by the sensor when the corrected signal Vs is observed after an establishment time of about 0.005*τ).

This is understood by drawing an analogy with the generic transfer function of a second-order system with index response, namely in the Laplace domain:

$$H_{(p)} = H_0 \frac{\omega_0^2}{p^2 + 2m'\omega_0 p + \omega_0^2}$$

with $\omega_0$ the natural pulsation of the system in question. For such a system, the maximum value for exceeding the output signal can be expressed as a function of the damping factor m'. More particularly, for an input voltage step, i.e.

$$E_p = \frac{1}{p}$$

in the Laplace domain, the following signal is obtained as output:

$$S_{(p)} = \frac{1}{p} \frac{\omega_0^2}{p^2 + 2m'\omega_0 + \omega_0^2} = \frac{1}{p} - \frac{p + 2pm'\omega_0}{(p + m'\omega_0)^2 + \omega_0^2(1-m'^2)}$$

where $\omega_s = \omega_0\sqrt{1-m'^2}$ represents the pseudo pulsation of the output signal in the underdamped regime. By inverse Laplace transform, the following is obtained in the time domain:

$$S_{(t)} = \left[1 - \frac{e^{-m'\omega_0 t}}{\sqrt{1-m'^2}} \sin(\omega_0 t + \varphi)\right] E_{(t)}$$

The maximum value for exceeding $M_d$ of the output signal with respect to the value of the step set as input of the system can be expressed as:

$$M_d = e^{\frac{-m'\pi}{\sqrt{1-m'^2}}}$$

By setting for example a maximum value for exceeding $M_d$ equal to 1.5% of the value of the step (which makes it possible to offset for example the effect of the first overdamped cell 10 when its damping factor m is chosen equal to 90 percent of the value corresponding to the critical regime of the first cell 10), the following is obtained:

$$m' = \sqrt{\frac{\ln^2(M_d)}{\ln^2(M_d) + \pi^2}} = 1.2$$

Such a leak detection system 300 can thus be used for detecting a leak by tracer gas (here hydrogen) with a response time that is improved with respect to that of the sensor 310 alone.

In the embodiment of FIG. 3, the phase advance correction device 1 comprises a first 10 and a second 20 correction cells of identical electronic structure, the first 10 and second 20 cells being connected in series.

In certain embodiments not shown, the phase advance correction device comprises several correction cells of the overdamped type and/or several correction cells of the underdamped type. For example the phase advance correction device comprises several cells 10 and 20 such as described hereinabove, placed in series and configured to obtain the global transfer function desired comprising at least one by-pass function. Each cell among the cells 10 has for example a damping coefficient configured to have a value comprised between 80 and 100 percent of the critical value of the cell 10 in question. Likewise, each cell among the cells 20 has for example a damping coefficient configured to have a value comprised between 110 and 120 percent of the critical value of the cell 20 in question.

On the contrary, in certain embodiments, the phase advance correction device comprises only one phase advance correction cell (overdamped or underdamped) in order to simplify the implementation.

In the embodiment of FIG. 3, the first 10 and second 20 correction cells are implemented in an active analogical form, here with a looped-back operational amplifier base. In this way, the adaptation problems of impedance, or of dispersion of the components used (capacitors, resistors), are minimized within the correction device 1. This makes it possible for example to prevent the oscillations before stabilisation of the corrected signal.

In other embodiments, the phase advance correction device is implemented passively, for example via a high-pass cell of the series capacitor and parallel resistor type.

In the embodiment of FIG. 3, the signal Ve delivered by the sensor is processed by the first overdamped cell 10 and the corrected signal Vs is delivered by the second underdamped cell 20.

In other embodiments, the order of the cells is inverted, i.e. the signal Ve delivered by the sensor is processed by an underdamped cell and the corrected signal Vs is delivered by an overdamped cell.

The invention claimed is:

1. A tracer gas leak detection system comprising at least one sensor operable to deliver a sensor signal (Ve) representative of a concentration of a tracer gas at said at least one sensor, characterised in that, for each of the at least one sensor, said system further comprises a corresponding phase advance correction device operable to deliver a corrected signal (Vs) from the sensor signal delivered by each sensor, said correction device comprising:
   at least one overdamped correction cell configured to approximate a correction of the proportional-derivative type; and
   at least one underdamped correction cell configured to approximate a correction of the proportional-derivative type.

2. The system according to claim 1 wherein a damping factor of said at least one overdamped correction cell has a value comprised between 80 and 100 percent of a first critical value corresponding to a critical regime of said at least one overdamped correction cell.

3. The system according to claim 2 wherein said damping factor of said at least one overdamped correction cell corresponds to a ratio between a time constant associated with a dominant zero of a transfer function of said at least one overdamped correction cell and a time constant of the sensor.

4. The system according to claim 2 wherein a damping factor of said at least one underdamped correction cell has a value comprised between 110 and 130 percent of a second critical value corresponding to a critical regime of said at least one underdamped correction cell.

5. The system according to claim 4 wherein said damping factor of said at least one underdamped correction cell corresponds to a ratio between a time constant associated with a dominant zero of a transfer function of said at least one underdamped correction cell and a time constant of the sensor.

6. The system according to claim 2 wherein said dampening factor of said at least one overdamped correction cell has a value equal to 90 percent of said first critical value corresponding to the critical regime of said at least one overdamped correction cell.

7. The system according to claim 4 wherein said at least one overdamped correction cell is operable to deliver a first corrected signal (Ves) from said sensor signal (Ve), and wherein said at least one underdamped correction cell is operable to deliver said corrected signal (Vs) from said first corrected signal.

8. The system according to claim 7 wherein at least one of said at least one overdamped correction cell or said at least one underdamped correction cell is implemented in an active analogical form.

9. The system according to claim 2 wherein said damping factor of said at least one underdamped correction cell has a value equal to 120 percent of said second critical value corresponding to the critical regime of said at least one underdamped correction cell.

10. The system according to claim 1 wherein said at least one overdamped correction cell is operable to deliver a first corrected signal (Ves) from said sensor signal (Ve), and wherein said at least one underdamped correction cell is operable to deliver said corrected signal (Vs) from said first corrected signal.

11. The system according to claim 1 wherein at least one of said at least one overdamped correction cell or said at least one underdamped correction cell is implemented in an active analogical form.

12. The system of claim 1 wherein the system is operable to detect a leak by said tracer gas.

* * * * *